US008649240B2

(12) United States Patent
McCombs

(10) Patent No.: US 8,649,240 B2
(45) Date of Patent: *Feb. 11, 2014

(54) MECHANISM FOR PEAK POWER MANAGEMENT IN A MEMORY

(71) Applicant: Apple Inc., Cupertino, CA (US)

(72) Inventor: Edward M. McCombs, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/769,542

(22) Filed: Feb. 18, 2013

(65) Prior Publication Data

US 2013/0176798 A1 Jul. 11, 2013

Related U.S. Application Data

(63) Continuation of application No. 13/286,365, filed on Nov. 1, 2011, now Pat. No. 8,400,864.

(51) Int. Cl.
*G11C 8/00* (2006.01)

(52) U.S. Cl.
USPC .................. 365/230.03; 365/230.06; 365/194

(58) Field of Classification Search
USPC .................. 365/230.03, 230.06, 194
See application file for complete search history.

(56) References Cited

U.S. PATENT DOCUMENTS

| 4,887,240 A | 12/1989 | Garverick et al. |
| 5,119,334 A | 6/1992 | Fujii |
| 5,590,086 A | 12/1996 | Park et al. |
| 6,868,026 B2 | 3/2005 | Fujioka |
| 7,477,557 B2 * | 1/2009 | Keeth et al. ................ 365/201 |
| 8,014,215 B2 | 9/2011 | Lee et al. |
| 8,400,864 B1 * | 3/2013 | McCombs ............... 365/230.03 |

(Continued)

FOREIGN PATENT DOCUMENTS

| JP | 61008796 | 1/1986 |
| JP | 10283781 | 10/1998 |
| JP | 11297075 | 10/1999 |
| JP | 2008305494 | 12/2008 |

OTHER PUBLICATIONS

Office Action from Japanese Patent Application No. 2012-208818, mailed Sep. 9, 2013 (English Translation), pp. 1-4.

(Continued)

*Primary Examiner* — Son Dinh
*Assistant Examiner* — Nam Nguyen
(74) *Attorney, Agent, or Firm* — Meyertons, Hood, Kivlin, Kowert & Goetzel, P.C.

(57) ABSTRACT

A mechanism for managing peak power in a memory storage array that includes sub-array blocks may reduce the peak currents associated with read and write operations by staggering the wordline signal activation to each of the sub-array blocks. In particular, the wordline units within each sub-array block may generate the wordline signals to each sub-array block such that a read wordline signal of one sub-array block does not transition from one logic level to another logic level at the same time as the write wordline of another sub-array block. Further, the wordline units may generate the wordline signals to each sub-array block such that a read wordline of a given sub-array block does not transition from one logic level to another logic level at the same time as a read wordline signal of another sub-array block.

15 Claims, 4 Drawing Sheets

(56) References Cited

U.S. PATENT DOCUMENTS

2002/0060949 A1    5/2002    Kim
2009/0132736 A1    5/2009    Hasan et al.
2011/0173462 A1    7/2011    Wakrat et al.

OTHER PUBLICATIONS

English Translation of Abstracts in Application Nos. 2008305494, 10283781, 61008796, 11297075; pp. 1-4.

* cited by examiner

US 8,649,240 B2

MECHANISM FOR PEAK POWER MANAGEMENT IN A MEMORY

PRIORITY INFORMATION

This application is a continuation of U.S. patent application Ser. No. 13/286,365, filed on Nov. 1, 2011, entitled "Mechanism For Peak Power Management In A Memory."

BACKGROUND

1. Technical Field

This disclosure relates to memories, and more particularly to peak power reduction.

2. Description of the Related Art

Many devices include embedded memories and/or onboard memories. In many such devices, these memories may take up a significant portion of the integrated circuit die. Accordingly, these memories can consume a great deal of power. However, rather than average power consumed, in some cases peak power can be problematic because surges or large peaks in current usage can cause voltage sags on the main Vdd supply. These voltage sags can cause improper operation of not only the memory, but also other circuits connected to the supply.

SUMMARY OF THE EMBODIMENTS

Various embodiments of a mechanism for managing peak power in a memory are disclosed. Broadly speaking, a mechanism for managing peak power in a memory storage array is contemplated. In a memory that includes many sub-array blocks, it may be possible to reduce the peak currents associated with read and write operations by staggering the wordline signal activation to each of the sub-array blocks. In particular, the wordline units may be configured to generate the wordline signals to each sub-array block such that a read wordline signal of one sub-array block does not transition from one logic level to another logic level at the same time as the write wordline of another sub-array block. Further, the wordline units may be configured to generate the wordline signals to each sub-array block such that a read wordline of a given sub-array block does not transition from one logic level to another logic level at the same time as a read wordline signal of another sub-array block.

In one embodiment, a memory includes a storage array including a number of sub-array blocks and each sub-array block includes a wordline driver unit. Each wordline driver unit may generate a read wordline signal to initiate a read operation and a write wordline signal to initiate a write operation such that the read wordline signal of a given wordline driver unit and the write word line of a different wordline driver unit do not transition from one logic level to another logic level at a same time.

In one specific implementation, each wordline driver unit may further generate the read wordline signal such that no read wordline signals transition from one logic level to another logic level at the same time.

Figure 1:
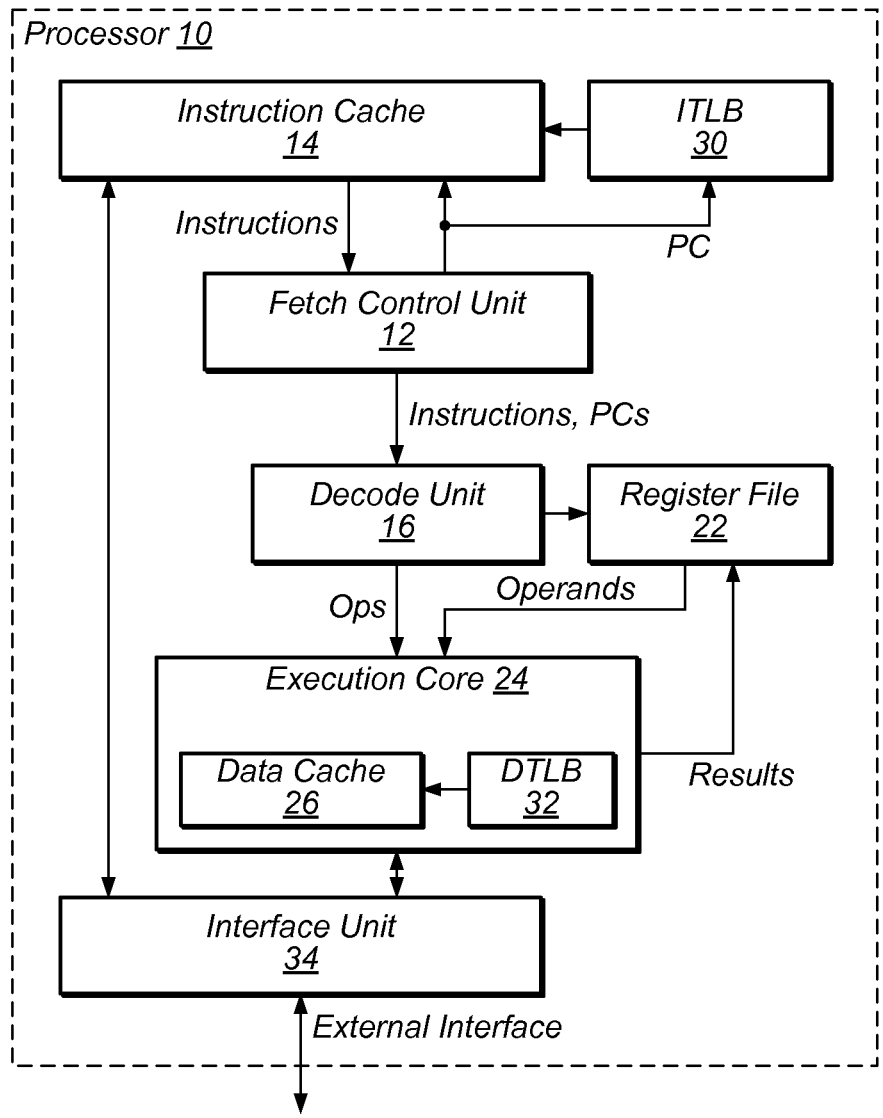
FIG. 1 is a block diagram of a processor.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a processor is shown. The processor 10 includes an instruction cache (ICache) 14 that is coupled to a fetch control unit 12. The processor also includes a decode unit 16 that is coupled to the fetch control unit 12 and to a register file 22, which is in turn coupled to an execution core 24. The execution core 24 is coupled to an interface unit 34, which may be coupled to an external interface of the processor 10, as desired. It is noted that components having a reference designator that includes both a number and a letter may be referred to using only the number where appropriate for simplicity.

In one embodiment, the fetch control unit 12 is configured to provide a program counter address (PC) for fetching from the instruction cache 14. The instruction cache 14 is configured to provide instructions (with PCs) back to the fetch control unit 12 to be fed into the decode unit 16. The decode unit 16 may generally be configured to decode the instructions into instruction operations (ops) and to provide the decoded ops to the execution core 24. The decode unit 16 may also provide decoded operands to the register file 22, which may provide operands to the execution core 24. The decode unit 16 may also be configured to schedule each instruction and provide the correct register values for execution core 24 to use.

The register file 22 may also receive results from execution core 24 that are to be written into the register file 22. Accordingly, the register file 22 may generally include any set of registers usable to store operands and results. Thus, the register file 22 may be implemented using a variety of storage types such as flip-flop type storages, random access memory (RAM), and the like.

The instruction cache 14 may include control logic and memory arrays. The memory arrays may be used to store the cached instructions to be executed by processor 10 and the associated cache tags. Instruction cache 14 may have any capacity and construction (e.g. direct mapped, set associative, fully associative, etc.). Instruction cache 14 may include any cache line size.

It is contemplated that the processor 10 may implement any suitable instruction set architecture (ISA), such as ARM™, PowerPC™, or x86 ISAs, combinations thereof, etc. In some embodiments, the processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, processor 10 may store a set of recent and/or frequently used virtual-to-physical address translations in a translation lookaside buffer (TLB), such as instruction TLB (ITLB) 30.

The execution core 24 may perform the various operations (e.g., MOV, ADD, SHIFT, LOAD, STORE, etc.) indicated by each instruction. In the illustrated embodiment, the execution core 24 includes data cache 26, which may be a cache memory for storing data to be processed by the processor 10. Like instruction cache 14, data cache 26 may have any suitable capacity, construction, or line size (e.g. direct mapped, set associative, fully associative, etc.). Moreover, data cache 26 may differ from the instruction cache 14 in any of these details. As with instruction cache 14, in some embodiments, data cache 26 may be partially or entirely addressed using physical address bits. Correspondingly, data TLB (DTLB) 32 may be provided to cache virtual-to-physical address translations for use in accessing data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

Interface unit 34 may generally include the circuitry for interfacing processor 10 to other devices on the external interface. The external interface may include any type of interconnect (e.g. bus, packet, etc.). The external interface may be an on-chip interconnect, if processor 10 is integrated with one or more other components (e.g. a system on a chip configuration). The external interface may be on off-chip interconnect to external circuitry, if processor 10 is not integrated with other components. In various embodiments, processor 10 may implement any instruction set architecture.

It is noted that each of the memories embedded within processor 10 (e.g., instruction cache 14, data cache 26, register file 22, etc.) may include wordline driver circuits to access their respective memory arrays. As described in greater detail below in conjunction with the description of FIG. 2, it may be possible to reduce the peak power associated with accessing the memory arrays of the embedded memories of processor 10 though the management of the wordline signals.

Figure 2:
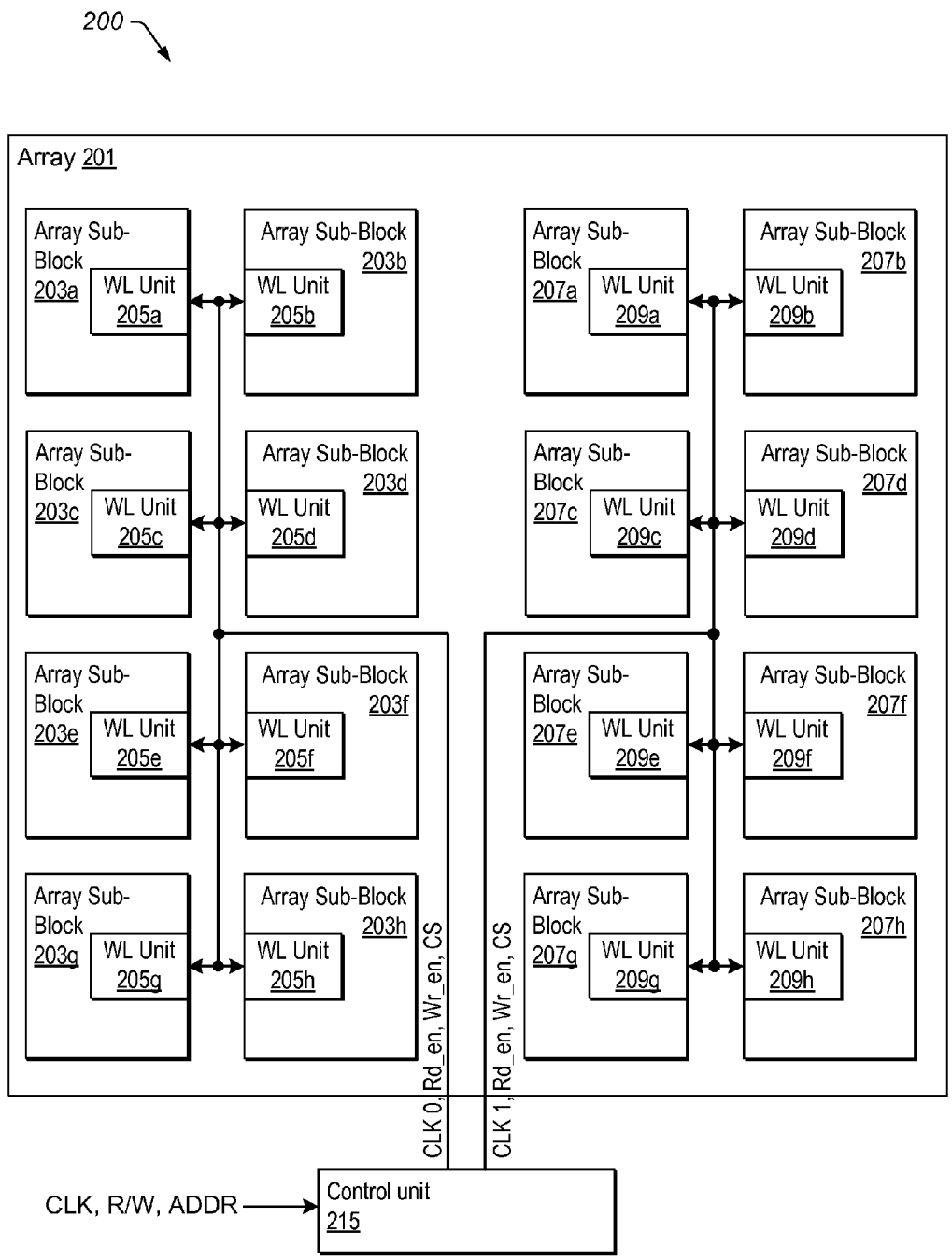
FIG. 2 is a block diagram of one embodiment of a portion of a memory including a mechanism to reduce peak power.

Referring to FIG. 2, a block diagram of one embodiment of a portion of a memory including a mechanism to reduce peak power is shown. The memory 200 includes an array 201 that is coupled to a control unit 215. It is noted that a number of features have been omitted from the drawings for the sake of brevity. For example, each of the sub-array blocks of FIG. 2 may include bit cells and bit lines (both not shown) for conveying and storing the read and write data.

In the illustrated embodiment, the array 201 includes several sub-array blocks (e.g., 203a through 203h and 205a through 207h). Each sub-array block includes respective a wordline driver unit (e.g., 205a through 205h and 209a through 209h), and a number of bit cells (not shown) to store the data. In addition, in one embodiment, the sub-array blocks are arranged into groups. In the illustrated embodiment, the sub-array blocks have been arranged such that blocks 203 form one group and blocks 205 form another group. Further, in one embodiment, a group of sub-array blocks (e.g., 203a-203h or 207a-207h) may be read or written but not both concurrently. In other words, if any of the sub-array blocks in a group are being read, then none of the sub-array blocks in that group may be written concurrent with the read operation. However, one group may be read while the other group is concurrently being written. In addition, in one embodiment, different sub-array blocks within the same group may be read concurrently, or written concurrently. For example, a read operation or a write operation may be performed to both sub-array block 203a and sub-array block 203h concurrently, but a write to sub-array block 203h while sub-array block 203a is being read would be prohibited.

Accordingly, the control unit 215 provides a separate set of control signals to each group of sub-array blocks. Specifically, in one embodiment, the control unit 215 may be configured to receive a clock signal (e.g., CLK), address information (e.g., ADDR), and read/write signals (e.g., R/W). The control unit 215 may provide two separate clock signals (e.g., CLK0 and CLK1) to the separate groups. For example, the CLK0 signal is provided to the group on the left (e.g., sub-array blocks 203a-203h), while the CLK1 signal is provided to the group on the right (e.g., sub-array blocks 207a-207h). The control unit 215 may also decode the ADDR information into one or more chip selects (e.g., CS) that may select which of the sub-array blocks will be accessed. The R/W signal may be decoded to produce a read enable or a write enable depending on whether it is a read access or a write access. In one embodiment, the CLK0 and CLK1 signals may be combined with the Wr_en and the Rd_en signals within each wordline unit 205 and 207 to generate a write wordline signal and a read wordline signal, respectively, to access the bit cells (not shown) in the sub-array blocks.

In one embodiment, to reduce the peak current and thus the peak power consumed during memory accesses, the concurrent reads and writes to the sub-array blocks may be staggered so that the edges of the wordline signals are not aligned in time. Accordingly, as shown in FIG. 3, the read wordline and the write wordline are staggered.

Figure 3:
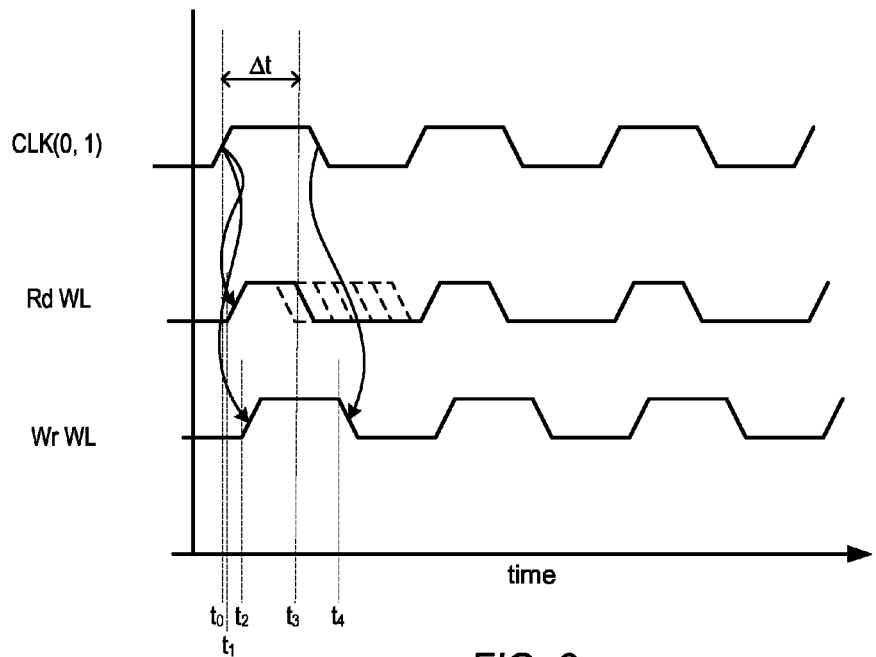
FIG. 3 is a timing diagram describing operational aspects of the embodiment of the memory of FIG. 2.

Turning to FIG. 3, a timing diagram depicting operational aspects of the embodiment of the memory of FIG. 2 is shown.

The timing diagram of FIG. 3 includes a clock signal (e.g., CLK(0,1) which may correspond to the CLK0 and/or the CLK1 signal of FIG. 2. In addition, the timing diagram includes a read wordline signal (e.g., Rd WL) and a write wordline signal (e.g., Wr WL).

In the illustrated embodiment, both the Rd WL and the Wr WL may be initiated by the leading edge of the CLK0, 1 signal which occurs at time $t_0$ and as indicated by the wavy arrows. In addition, the falling edge of the Wr WL is also initiated by the falling edge of the CLK0, 1 signal, also indicated by a wavy arrow. Accordingly, the Wr WL duration is frequency dependent. However, as shown, the falling edge of the Rd WL is not initiated by the falling edge of the CLK0, 1 signal. Instead, in one embodiment, the falling edge, at time $t_3$, of the Rd WL may be based upon some predetermined amount of time after the rising edge of the Rd WL as indicated by the Δt. Thus, the Rd WL duration is frequency independent.

As shown in FIG. 3, the rising edge of the Rd WL begins at time $t_1$, which may correspond to a small delay after the rising edge of the CLK0, 1 signal. In contrast, the rising edge of the Wr WL begins at time $t_2$, which may be a significantly longer delay than the Rd WL delay since write operations occur quickly in comparison to read operations.

In the illustrated embodiment, the falling edge of the Rd WL may be adjustable as indicated by the dashed lines, dependent upon a number of factors such as sense amplifier type, bit line capacitance, operating voltage, etc. More particularly, in various embodiments, any of a variety of timing circuits may be used to determine when the Rd WL falling edge will begin. For example, as a timer circuit, a wordline kill circuit or some other type of timing circuit may be used.

Further, in one embodiment, the delays associated with the rising edges of the Rd WL and the Wr WL may be implemented using gate delays within the WL units of FIG. 2. For example, within each WL unit 205 and 209 one or more logic gates such as inverters, buffers, or the like may be daisy chained to provide an appropriate delay for the respective wordline signal. In one embodiment, the CLK0 or CLK1 signal may be delayed internally at each WL unit 205 and 209, while in other embodiments the Rd en or Wr_en may be delayed.

As mentioned above and described further below, each Rd WL and each Wr WL may also be staggered with respect to each other WL unit. In one embodiment, the leading or rising edges may be staggered, while in another embodiment the trailing edges may be staggered, and in yet other embodiments, both the leading and trailing edges may be staggered. An exemplary timing diagram depicting such a staggered wordline arrangement is shown in FIG. 4.

Figure 4:
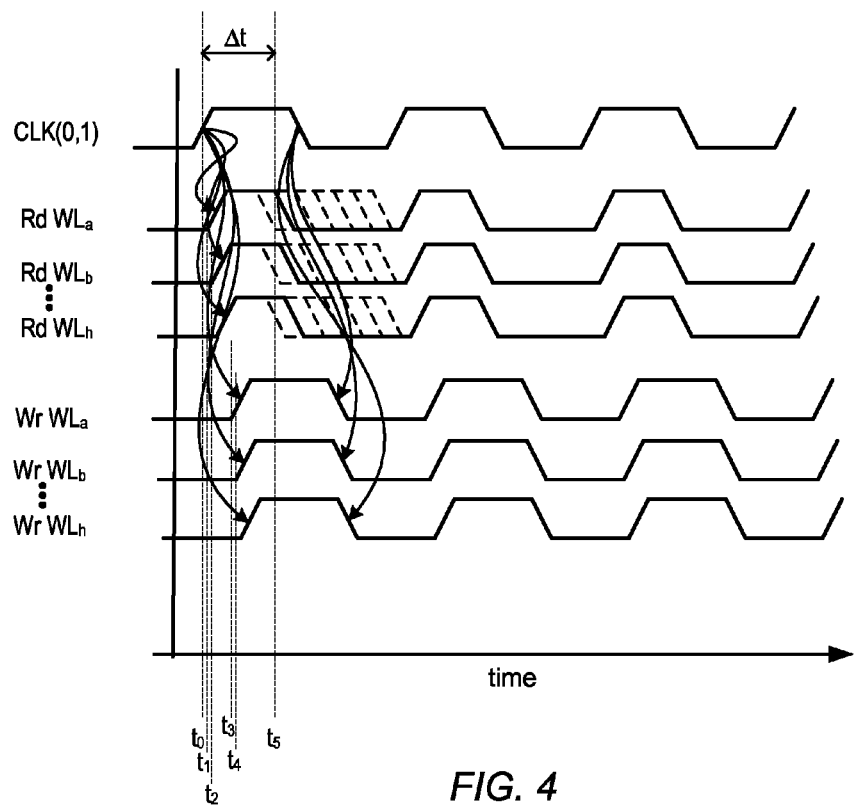
FIG. 4 is a timing diagram describing additional operational aspects of the embodiment of the memory of FIG. 2.

Referring to FIG. 4, a timing diagram depicting additional operational aspects of the embodiment of the memory of FIG. 2 is shown. Similar to the timing diagram shown in FIG. 3, the timing diagram of FIG also shows a clock signal (e.g., CLK (0,1) which may correspond to CLK0 and/or CLK 1 signals of FIG. 2. However in contrast to FIG. 3, the timing diagram of FIG. 4 includes multiple read wordline signals (e.g., Rd $Wl_a$-$WL_h$), and multiple write wordline signals (e.g., Wr $Wl_a$-$WL_h$), which may be representative of the wordline signals provided by the WL units 205 and 209 of FIG. 2.

As shown in FIG. 4, all of the Rd WL signal leading edges and all of the Wr WL signal leading edges are triggered by the CLK (0,1) signal which occurs at time $t_0$. In addition, in one embodiment, each of the Rd WL signal leading edges is staggered relative to one another such that none of the Rd WL leading edges are aligned. For example, Rd $WL_a$ is initiated at time $t_1$ and Rd $WL_b$ is initiated at time $t_2$, and so forth.

Similarly, each of the Wr WL signal leading edges is staggered relative to one another such that none of the Wr WL leading edges are aligned. For example, Wr $WL_a$ is initiated at time $t_3$ and Wr $WL_b$ is initiated at time $t_4$, and so forth.

Further, similar to the falling edges described above in conjunction with the description of FIG. 3, the falling edges of the Wr WLa-WLh are also initiated by the falling edge of the CLK0, 1 signal, and the Rd WLa-WLh falling edges such as that shown at time $t_5$ may be adjustable as indicated by the dashed lines, and based upon some predetermined amount of time after the rising edge of the Rd WL as indicated by the Δt.

Figure 5:
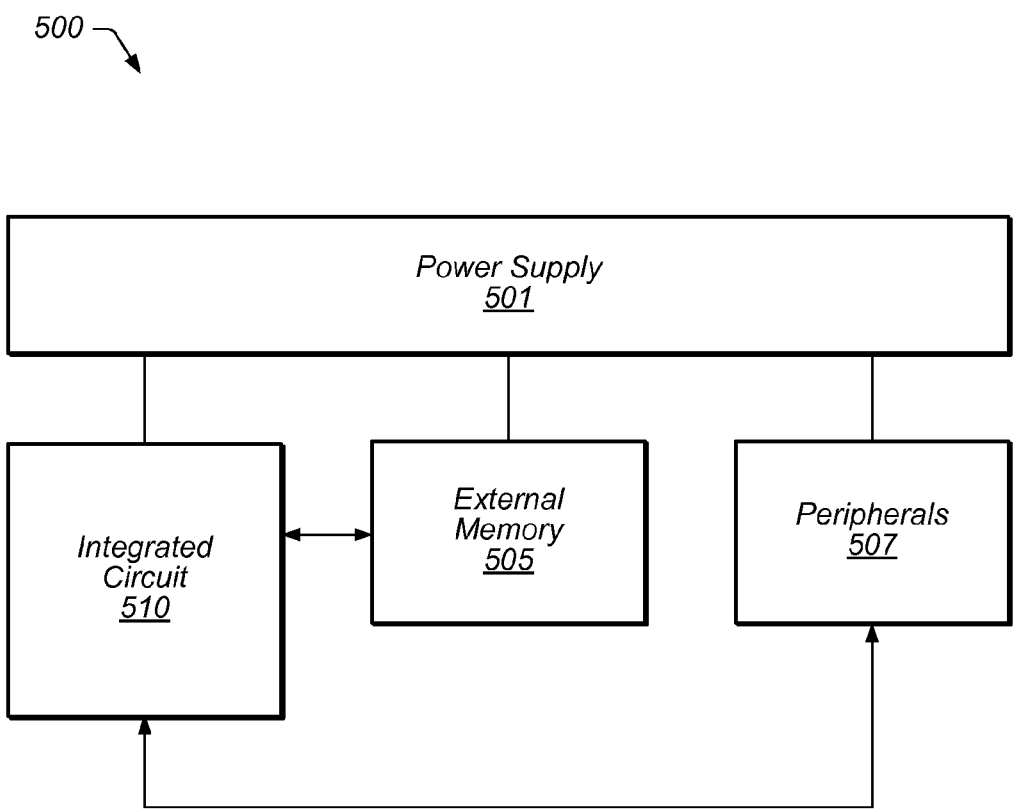
FIG. 5 is a block diagram of one embodiment of a system.

Turning to FIG. 5, a block diagram of one embodiment of a system is shown. The system 500 includes at least one instance of an integrated circuit 510 coupled to one or more peripherals 507 and an external system memory 505. The system 500 also includes a power supply 501 that may provide one or more supply voltages to the integrated circuit 510 as well as one or more supply voltages to the memory 505 and/or the peripherals 507.

In one embodiment, the integrated circuit 510 may be a system on a chip (SOC) including one or more instances of a processor such as processor 10 of FIG. 1, and various other circuitry such as a memory controller, video and/or audio processing circuitry, on-chip peripherals and/or peripheral interfaces to couple to off-chip peripherals, etc. Accordingly, the integrated circuit 510 may include one or more instances of an embedded memory such as memory 200 of FIG. 2. Thus, embodiments that include the memory 200 may also include WL units that stagger read and write wordline signals as described above in conjunction with the description of FIG. 2 through FIG. 4.

The peripherals 507 may include any desired circuitry, depending on the type of system. For example, in one embodiment, the system 500 may be included in a mobile device (e.g., personal digital assistant (PDA), smart phone, etc.) and the peripherals 507 may include devices for various types of wireless communication, such as WiFi, Bluetooth, cellular, global positioning system, etc. The peripherals 507 may also include additional storage, including various types of RAM storage, solid-state storage, or disk storage. As such, the peripherals 507 may also include RAM that includes the WL units described above. The peripherals 507 may include user interface devices such as a display screen, including touch display screens or multitouch display screens, keyboard or other input devices, microphones, speakers, etc. In other embodiments, the system 500 may be included in any type of computing system (e.g. desktop personal computer, laptop, workstation, net top etc.).

The external system memory 505 may be representative of any type of memory. For example, the external memory 505 may be in the DRAM family such as synchronous DRAM (SDRAM), double data rate (DDR, DDR2, DDR3, etc.), or any low power version thereof. However, external memory 505 may also be implemented in SDRAM, static RAM (SRAM), or other types of RAM, etc. Accordingly, external system memory 505 may also include WL units as described above in conjunction with the description of FIG. 2 through FIG. 4.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
a storage array including a plurality of sub-array blocks;
wherein each of the sub-array blocks includes a wordline driver unit configured to generate a read wordline signal to initiate a read operation and a write wordline signal to initiate a write operation such that no read wordline signal transitions from one logic level to another logic level at a same time as any other read wordline signal.

2. The memory as recited in claim 1, wherein each wordline driver unit is further configured to generate the write wordline signal such that no write wordline signals transition from one logic level to another logic level at a same time as any other write wordline signal.

3. The memory as recited in claim 1, wherein each wordline driver unit is further configured to generate the read wordline signal and the write wordline signal such that a rising edge of the read wordline signal of a given wordline driver unit and a rising edge of the write wordline signal of the different wordline driver unit do not transition from one logic level to another logic level at the same time.

4. The memory as recited in claim 1, wherein each wordline driver unit is further configured to generate the read wordline signal and the write wordline signal such that a falling edge of the read wordline signal of a given wordline driver unit and a falling edge of the write wordline signal of the different wordline driver unit do not transition from one logic level to another logic level at the same time.

5. The memory as recited in claim 1, wherein each wordline driver unit is further configured to cause a falling edge of the read wordline signal to transition after a predetermined amount of time.

6. The memory as recited in claim 1, wherein each wordline driver unit is further configured to cause a falling edge of the write wordline signal to transition in response to a falling edge of a clock signal.

7. A system comprising:
a memory; and
one or more processors coupled to the memory, wherein at least one of the one or more processors includes an embedded memory;
wherein the embedded memory includes:
a storage array including a plurality of sub-array blocks;
wherein each of the sub-array blocks includes a wordline driver unit configured to generate a read wordline signal to initiate a read operation and a write wordline signal to initiate a write operation such that no read wordline signal transitions from one logic level to another logic level at a same time as any other read wordline signal.

8. The system as recited in claim 7, wherein each wordline driver unit is further configured to generate the read wordline signal and the write wordline signal such that a rising edge of the read wordline signal of a given wordline driver unit does not transition from one logic level to another logic level at the same time as a rising edge of the write wordline signal of the different wordline driver unit.

9. The system as recited in claim 7, wherein each wordline driver unit is further configured to cause a falling edge of the read wordline signal to transition after a predetermined amount of time.

10. The system as recited in claim 7, wherein each wordline driver unit is further configured to generate the read wordline signal and the write wordline signal such that a falling edge of the read wordline signal of a given wordline driver unit does not transition from one logic level to another logic level at the same time as a falling edge of the write wordline signal of the different wordline driver unit.

11. The system as recited in claim 7, wherein each wordline driver unit is further configured to cause a falling edge of the write wordline signal to transition in response to a falling edge of a clock signal.

12. A mobile communication device comprising:
a memory; and
a processor coupled to the memory, wherein the processor includes an embedded memory including:
a storage array including a plurality of sub-array blocks;
wherein each of the sub-array blocks includes a wordline driver unit configured to generate a read wordline signal to initiate a read operation and a write wordline signal to initiate a write operation such that no read wordline signal transitions from one logic level to another logic level at a same time as any other read wordline signal.

13. The mobile communication device as recited in claim 12, wherein each wordline driver unit is further configured to generate the read wordline signal such that a rising edge of the read wordline signal of a given wordline driver unit does not transition from one logic level to another logic level at the same time as a rising edge of the read wordline signal of any other wordline driver unit.

14. The mobile communication device as recited in claim 12, wherein each wordline driver unit is further configured to generate the write wordline signal such that a rising edge of the write wordline signal of a given wordline driver unit does not transition from one logic level to another logic level at the same time as a rising edge of the write wordline signal of any other wordline driver unit.

15. The mobile communication device as recited in claim 12, wherein each wordline driver unit is further configured to cause a falling edge of the write wordline signal to transition in response to a falling edge of a clock signal, and to cause a falling edge of the read wordline signal to transition after a predetermined amount of time.

* * * * *